United States Patent [19]

Chen

[11] Patent Number: 5,022,955
[45] Date of Patent: Jun. 11, 1991

[54] APPARATUS AND METHOD FOR SELF-INDUCED REPAIR OF CIRCUIT SHORTS AND NEAR-SHORTS

[75] Inventor: Chengjun J. Chen, Yorktown Heights, N.Y.

[73] Assignee: International Business Machines Corporation, Armonk, N.Y.

[21] Appl. No.: 617,114

[22] Filed: Nov. 21, 1990

Related U.S. Application Data

[63] Continuation-in-part of Ser. No. 475,583, Feb. 6, 1990.

[51] Int. Cl.$^5$ .................. B44C 1/22; C03F 1/02; C03C 15/00; B23H 3/00
[52] U.S. Cl. .................. 156/627; 156/643; 156/646; 156/654; 156/656; 156/345; 204/129.2; 204/129.4
[58] Field of Search ............... 156/627, 643, 644, 646, 156/654, 656, 666, 901, 902, 345; 204/129.1, 129.2, 129.25, 129.4, 129.5, 129.55, 192.32, 192.35

[56] References Cited

U.S. PATENT DOCUMENTS 4,919,971 4/1990 Chen .................. 427/98

Primary Examiner—William A. Powell
Attorney, Agent, or Firm—David Aker

[57] ABSTRACT

An automatic method and apparatus for the repair of circuit shorts and near-shorts present in narrow bridges or remnants of bridges between circuit lines. By applying a voltage across a pair of lines, certain electrical phenomena take place at the area of the short or near-short. The electrical phenomena thus generated induce a localized etching in either a gas-phase or liquid-phase medium depending upon which embodiment is used. The circuit lines are classified into four groups so that no adjacent lines belong to the same group. All lines in a group are connected to one of four separate electrical conductors. Each conductor is connected to one phase of a four phase ac source. All the shorts and near shorts on a circuit are repaired simultaneously and automatically in a single operation without having to locate the shorts and near shorts.

21 Claims, 5 Drawing Sheets

FIG. 6
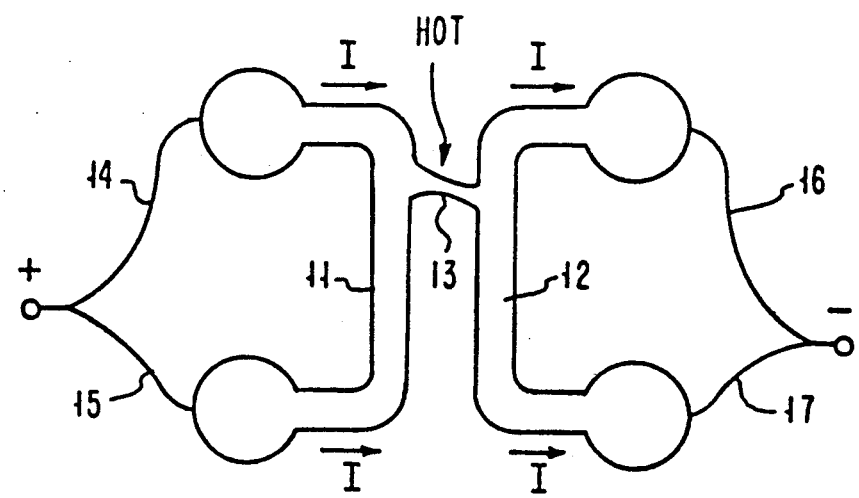
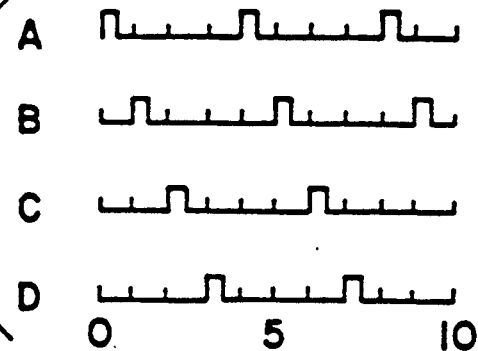
FIG. 7a
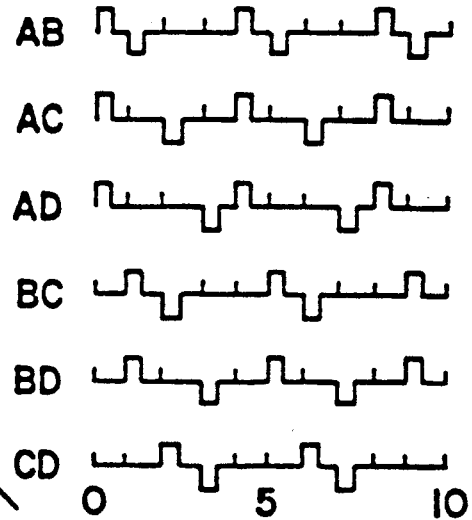
FIG. 7b

APPARATUS AND METHOD FOR SELF-INDUCED REPAIR OF CIRCUIT SHORTS AND NEAR-SHORTS

This application is a continuation-in-part of application Ser. No.: 07/475,583 filed Feb. 6, 1990.

BACKGROUND OF THE INVENTION

1. Field of the Invention

The present invention relates to an automatic method to repair circuit shorts and near-shorts present in narrow bridges or remnants of bridges between circuit lines. By applying a voltage across a pair of lines, certain electrical phenomena take place at the area of the short or near-short. The electrical phenomena thus generated induce a localized etching in either a gas-phase or liquid-phase medium depending upon which embodiment is used.

In particular, the invention comprises two embodiments:

The first embodiment covers the repair of a near-short circuit which includes two methods: (A) A dry method in a gas chamber where a high voltage (i.e. 100-500V) generates a localized discharge (microplasma) at the narrowest point of the gap between the two lines that generates reactive ions that etch away the unwanted metal and make the gap wider; and (B) a wet method using an etching solution whose etching rate depends sharply on temperature or electric current or both, and applying a certain voltage between these two lines so that a high field concentration is created at the narrowest point of the gap between the two lines which in turn generates an area of very high current concentration that etches away the unwanted metal and makes the gap wider.

The second embodiment covers the repair of a short circuit, which includes two methods: (A) A dry method using a gas phase which utilizes a temperature dependent chemical reaction; and (B) A wet method using a liquid phase which utilizes a temperature dependent wet etching reaction.

The repair of the short is a self-intensifying process that accelerates automatically until the bridge is broken, and then it stops automatically. At that point, the gap is in general too narrow. It is then treated as a near-short as described in the first embodiment.

2. Description of the Art

As is well known, the performance and reliability of computers and any other electronic system today depend heavily on packaging technology. As a result of the tremendous progress of the speed of the chips, the time delay of signals propagating in the wires connecting the chips has becomes the major obstacle to increasing the speed of the entire computer. Since the propagation speed of any signal cannot exceed the velocity of light in the medium, it is necessary to reduce the size of the computer as much as possible. Therefore the width and spacing of wiring has become smaller and smaller, and the resolution limit of lithographic processes has been pushed continuously. Thus, the elimination of defects in the circuits is related directly to the performance and reliability of computers and any other electronic system.

For the purpose of providing some background with respect to the two embodiments of the present invention, a description of the four kinds of defects found on the boards, cards and modules is useful. These defects comprise:

1. Circuit open. A line with an open gap or space can be detected easily by continuity testing. However, to locate the physical position of the site, usually by visual inspection with a microscope, is a time consuming and expensive operation.

2. Near open. If a portion of a line necks down so it becomes much narrower or thinner than the rest of the line it could become completely open due to excessive current or mechanical fatigue thus causing failure. (see e.g., FIG. 1(b)).

A method of repairing partially defective conductor lines is disclosed in U.S. Pat. No. 4,919,971. The defective site in the circuit comprises narrow necks or thin portions or cracks in a conductor line which is heated by passing a relatively high current therethrough. Using the thermobattery principle in an electroplating process or an electroless plating process or a pyrolytic deposition process, a conductive material is deposited at the defective site, and the partially defective conductor line is thereby repaired. A method of repairing gaps and circuit opens in a conductor line is also disclosed in the application.

3. Circuit short. This defect can be detected by testing the resistance between all pairs of lines. To fix it, the bridge between the pair of lines is visually located and manually cut off or ablated with a laser. See e.g., FIG. 1(c).

4. Near short. When the gap between two lines is too narrow, i.e., existence of an incomplete bridge, it is a potential defect which may affect long-term reliability of the computer. Presently, the near-shorts are treated by visually inspecting the entire area of the circuit, then manually removing the protrusions with a focused laser. See e.g., FIG. 1(d).

The present invention relates to the "shorts" and "near-shorts" as described above. It is clear with respect to all the defects noted above that the visual and manual processes and laser processes for inspection and repairing are very labor intensive, tedious and expensive.

There is a striking similarity between the two groups of defects, i.e., the opens and near opens on one hand, (see FIGS. 1(a) and (b)), and the shorts and near-shorts on the other hand. (See FIGS. 1(c) and (d))

A circuit short, FIG. 1(c), is formed by a conducting filament (referred to as a bridge) running from one line to another, which is similar to a near-open, FIG. 1(b). The repair process for the circuit short is to remove the filament or bridge that causes the short rather than to expand it.

A near-short, FIG. 1(d), is similar to a open circuit, FIG. 1(a), which consists of a gap in the otherwise continuous conductor. The repair process for the near-short is to expand the gap between the bridge remnants rather than to bridge it.

The electrical phenomena occurring at the shorts and near-shorts are exactly the same as in the case of opens and near-opens. That is, there is local Joule heat at the conducting filament (bridge remnants) in the near-short and there is local concentration of electrical field at the gap between the two pieces of metal in the open.

Therefore, a self-induced repair process for repairing shorts and near-shorts can utilize etching processes induced by local Joule effect or local concentration of electrical field, in accordance with the present invention, as is disclosed more fully hereinafter.

DESCRIPTION OF THE DRAWINGS

FIG. 6 depicts a simplified schematic view of a circuit short system which is treated in accordance with the present invention.

FIGS. 7a—7b depict the waveforms associated with a four-phase power supply for parallel testing and repairing of shorts and near-shorts. At (a) the four groups of lines are labeled A, B, C, and D, respectively and at (b) the waveforms between each pair of groups is shown.

SUMMARY OF THE INVENTION

All the defects described above have one thing in common: by applying an appropriate current or voltage on the defective line or between the defective lines, a local electrical phenomenon will occur right at the defect site.

For example, by passing a current through a line with a near-open, the defect site will be hotter than the normal portions of the line. This is because the narrow neck has a higher resistance per unit length and has poor thermal conductance compared to the rest of the line. Thus, more Joule heat is generated with less dissipation.

By applying a voltage to a line with a circuit open, if the gap is narrow, the electrical field intensity is concentrated in the gap region.

By applying a voltage between two lines with a near-short, the narrowest gap region between the bridge remnants has the highest electrical field intensity.

By applying a voltage between a pair of shorted lines, a current will pass from one line to another through the conducting bridge. Since in almost all cases, the conducting bridge is much thinner than the good lines, it is hotter than the normal portions of both lines.

Figure 1A:
FIGS. 1a—1d depict the four types of circuit defects found in the prior art as described herein.
Figure 1B:
Figure 1C:
Figure 1D:
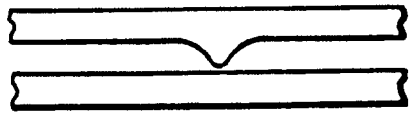

The present invention relates to an automatic method to repair the categories of defects described above as a "near-short" and a "circuit short." (See FIGS. 1(c) and 1(d)) It has been observed that most of the bridges which make the short circuit are caused by local defects, and have much smaller cross sections than the normal lines. Thus, by passing a current through a pair of lines having a bridge between them, the bridge will be heated up preferentially. By connecting both ends of each line to a power supply, the preferential heating of the bridge will occur even if the cross section of the bridge is comparable with that of the line itself. These kinds of shorts are referred to as "self-repairable."

It has been determined that if the bridge is thicker than the line itself, it is deemed not self-repairable and will have to be treated manually.

In the repair of a near-short, a high ac voltage is applied across the pair of lines embedded in a gas atmosphere, whereupon, a localized glow discharge occurs at the narrowest gap between the conductor lines. As a result, plasma etching occurs on both sides of the near-shorts.

The present invention utilizes the well-known scientific principle that the breakdown voltage of a gas discharge depends upon the product of pressure and distance between the electrodes (Paschen's law). For example, for a given pressure, the breakdown voltage is proportional to the width of the gap. Since the breakdown voltage is a function almost linearly of the distance, by ramping up the amplitude of the ac voltage, at a certain point, a glow discharge will occur right at the spot of the worst near-short. The value of the voltage depends on the minimum gap width and the nature of the gas ambient. An ac voltage is preferred because a symmetric etching of both ends of the near-short is being activated.

In addition, the near-short can be repaired using an etching solution. By applying a voltage across a pair of lines with a near-short (i.e. having a bridge remnant in between), the electrical field is concentrated at the narrowest point of the gap between these two lines. The current passing the solution is concentrated in that region. Either by an electro-chemical reaction or by heating effect at the ends of the near-short, the etching rate is much higher than elsewhere. Therefore, only the unwanted metal is removed by this self-induced preferential etching.

The processes of the present invention are self-aligned since there is no need to identify the physical location of the defect except the line (or lines) involved. It is also self-limiting, because once the symptom is eliminated, the process terminates by itself.

The invention further contemplates a method for the simultaneous repair of a plurality of electronic circuit shorts resulting from bridges between lines on a substrate comprising the steps of classifying the lines into four groups so that no adjacent lines belong to the same group; providing an electrical connection means for each of the groups which electrically connects to each line in its respective group; and applying an appropriate voltage sequentially between selected pairs of the electrical connection means until voltage has been applied to each of the pairs.

The voltage is sufficient to cause the temperature of the bridges to be greater than that of the lines and to therefore cause the bridges to be etched locally by means of a temperature-sensitive etching process until the bridges become electrically open.

In accordance with the invention there is also provided an apparatus for the repair of electronic circuit shorts resulting from bridges between lines on a substrate. The apparatus includes means for making an electrical connection to each of the lines. A grouping means classifies the lines into four distinct groups so that no adjacent lines belong to the same group. The grouping means further provides a separate electrical connection means for each of the groups. Each of the electrical connection means extends to each line in its respective group. An electrical energy means supplies an appropriate voltage between selected pairs of the electrical connection means sequentially until the voltage has been applied at least once to each pair. The voltage is sufficient to cause temperature of the bridges to be greater than temperature of the lines and to cause the bridges to be etched locally by means of a temperature-sensitive etching process until the bridges become electrically open.

In accordance with the method and in the apparatus, each electrical connection means is connected to one phase of a four phase alternating current supply. Each phase supplies voltage pulses at a time different from each other phase.

The grouping means may include an array of programmable switches and an array of connector pins. Each pin is used for connection to one of the lines and is electrically connected to one of the electrical connection means.

DESCRIPTION OF THE PREFERRED EMBODIMENTS

More particularly, the self-induced repair process of the present invention is designed to etch out a thin bridge that causes a pair of lines to become short-circuited. By passing a current to the bridge through the pair of lines, the thin bridge will be heated up selectively.

If a circuit board having lines with a bridge or a short therebetween is placed in an etching environment (gas phase or liquid phase) having an etching rate that depends sharply on temperature, the bridge is etched selectively. As the process goes on, the bridge becomes narrower. The local heating is intensified. Eventually, the bridge becomes broken and the short circuit is removed; that is to say, it becomes open. At that point, the gap is usually too narrow for commercial purposes and thus is considered to be a near-short. Further etching using a similar self-induced mechanism is required to make the circuit reliable.

The two kinds of processes that can be used for heterolocalized etching are wet and dry etching processes.

The wet process utilizes the temperature dependence of the etching rate of certain solutions. In accordance with the present invention, etchants which can be used are those substances that etch the metal that comprises the line (usually copper) very slowly at room temperature but substantially more rapidly at elevated temperatures, e.g. about 60-70° C.

For example, at room temperature (20° C.), dilute sulfuric acid (10-25 wgt. %) attacks copper very slowly. But at 70° C., the etching rate is at least 300 times higher than at room temperature.

Figure 2:
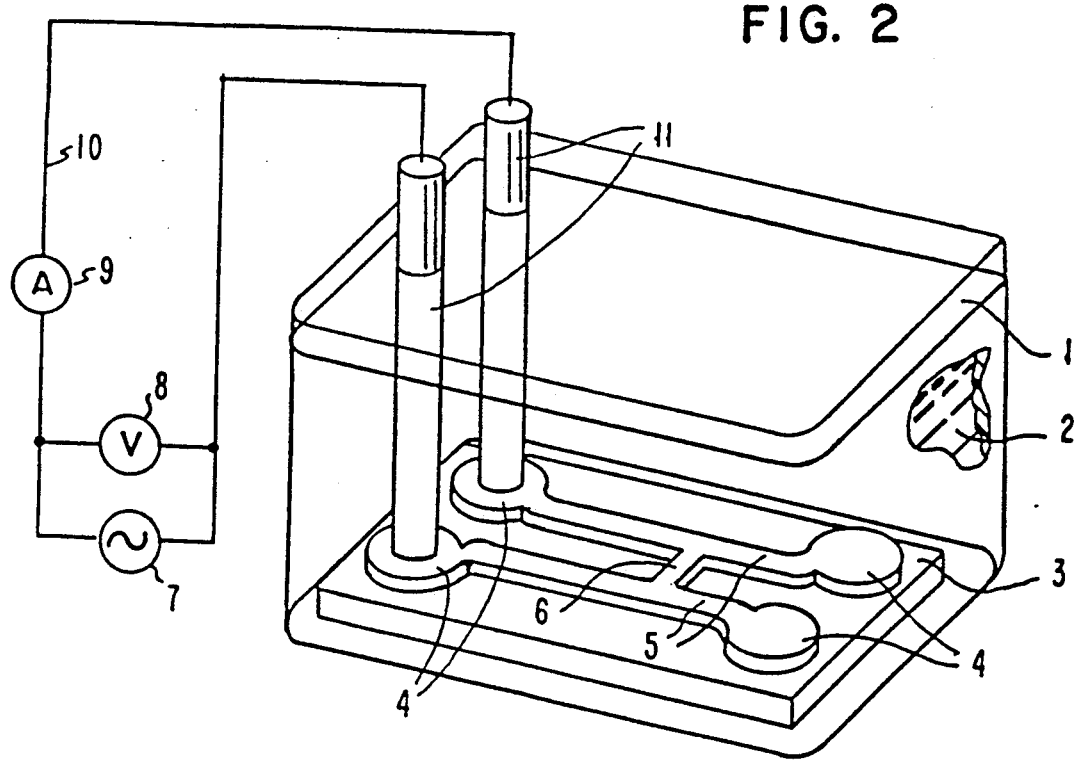
FIG. 2 is a perspective view of the system showing the repair of a circuit having a short or spacing violation using a solution.

For an understanding of one of the embodiments of the present invention, reference is made to FIG. 2 which is a perspective of the system showing the repair, using a solution, of a circuit having a short. More specifically, FIG. 2 discloses a container 1 which holds etching solution 2 therein. Immersed in etching solution 2 is a substrate 3 having conductor lines 5 disposed thereon, each conductor line 5 having two terminal ends 4. Conductor lines 5 are connected by a defect which in this instance is a short (bridge) 6. A probe 11 is connected to a terminal end 4 of each conductor line 5. The two probes are interconnected by wires 10 through an ac power supply 7, ac volt-meter 8 and ac ammeter 9. As a result of passing a current through the line 5, heat is generated at the bridge 6 and it starts to dissolve. As its narrowest part is etched, the local resistance increases and local heating is therefore enhanced which in turn accelerates the local etching process. The etching process at the narrowest part progresses exponentially to result in a complete open. Depending upon the extent of the etching, the process can be terminated or the process described hereinafter relating to near-shorts commences.

Figure 3:
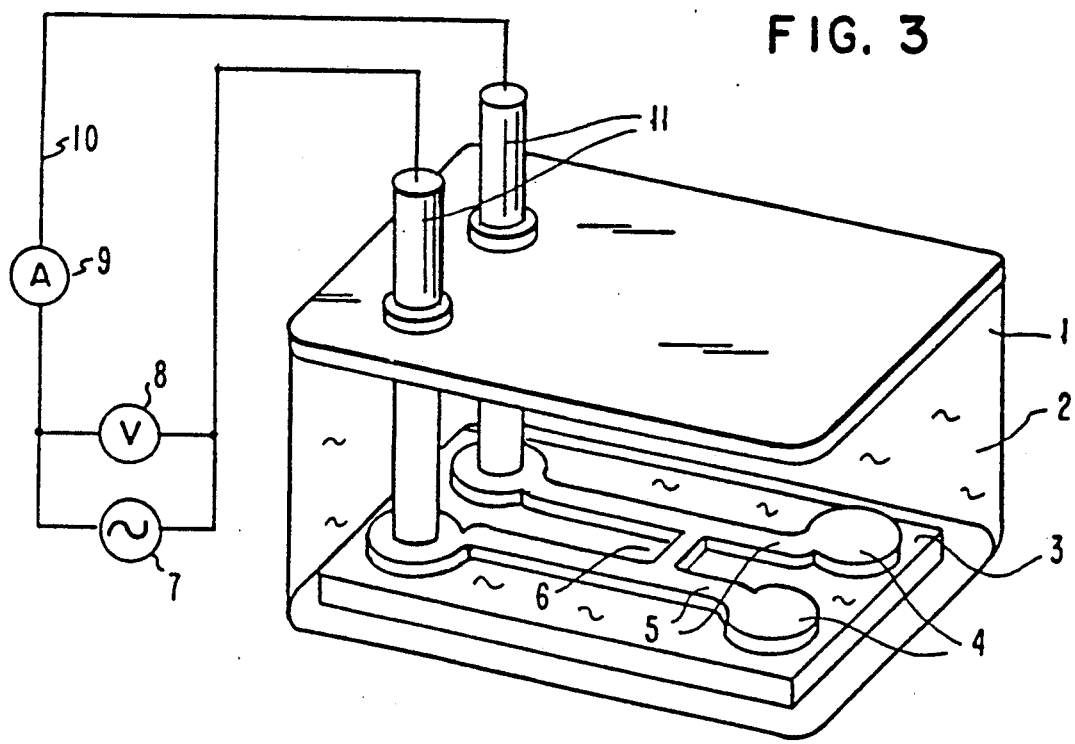
FIG. 3 is a perspective view of the system showing the repair of a circuit having a short in a chamber using an etching gas.

FIG. 3 discloses a dry self-induced repair of circuit shorts. FIG. 3 discloses a chamber 1 which contains an etching gas 2 therein. The chamber also contains substrate 3 which has conductor lines 5 disposed thereon, each conductor line 5 having two terminal ends 4. Conductor lines 5 are connected by defect or bridge 6. As is the case in the system described in FIG. 2 above, the system contains two probes 11 each of which is connected to a terminal end 4 on each of the lines 5 and to each other by wires 10 through a power supply 7, an ac volt-meter 8 and ac ammeter 9. An example of an etching gas, which can be used conveniently in this embodiment of the invention is bromine gas which upon application of heat results in a vigorous etching reaction at bridge 6.

As noted above, in many instances the repair of the short will terminate on its own with the configuration of the short defect after treatment taking on the characteristics of a near-short. Thus, in order to properly repair the circuit, the procedure described hereinafter for repair of a near-short should be used. For example, in the wet etching process described as illustrated by FIG. 2 above, the Joule process terminates when a complete open is generated. However, the etching process will continue if a certain voltage is applied on the pair of lines. The remnants of the bridge form an area with high field concentration, which in turn generates an area of very high current concentration. This induces local electrolytic etching or local heating, or both on both ends of the remnants and makes the gap larger. For native near-shorts, this process works equally efficiently.

For repairing near-shorts, the gas phase self-induced etching has some advantages over the wet process. By enclosing the circuit board in a chamber filled with high pressure gas, for example, 760 Torr of argon, connecting the pair of lines having a near-short to a power supply and ramping the voltage up, a local plasma will occur at the narrowest gap. Since the discharge process is highly non-linear, the plasma is highly localized. Etching occurs at the two ends of the metal comprising the bridge remnants and makes the gap wider.

By mixing certain gases that generate reactive ions in the chamber and applying a voltage as above, etching can be made more efficient, and the product can be volatile. For example by mixing $CF_3Br$ with argon, bromine atoms (and excited atoms as well as ions) are generated which react with the copper and generate copper bromide, which is volatile.

Figure 4:
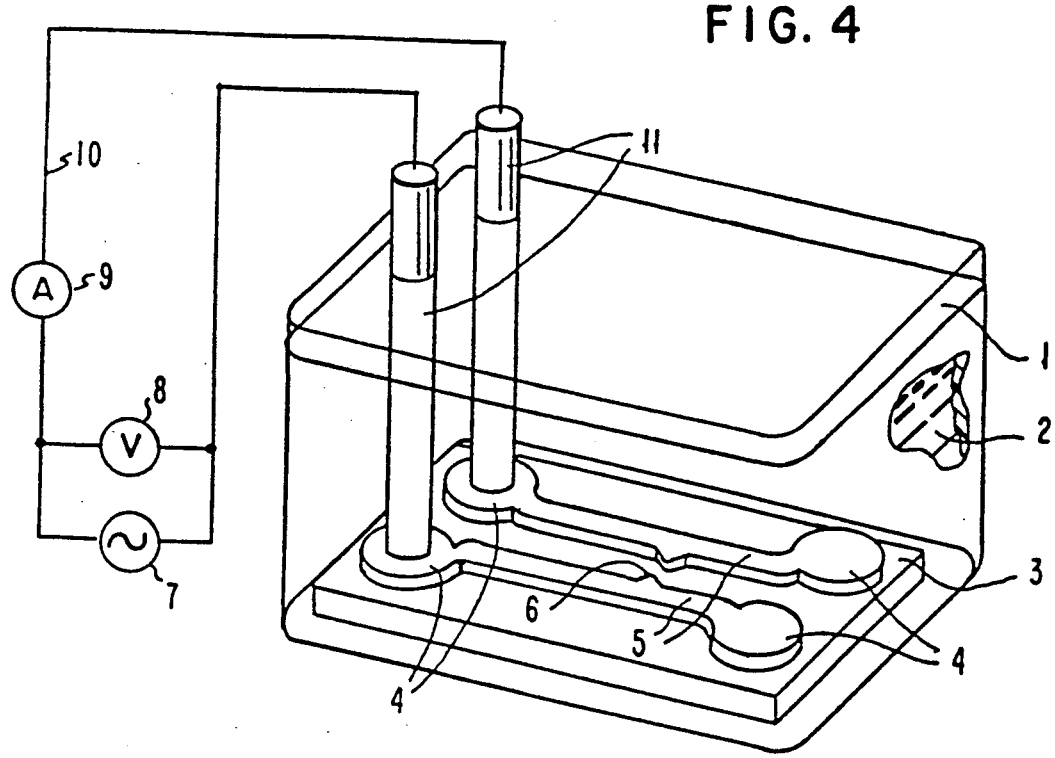
FIG. 4 is a perspective view of the system showing the repair of a circuit having a near-short using a solution.

An illustration of the system used in the repair of a circuit having a near-short is shown in FIG. 4. FIG. 4 is a perspective view of a system that can be used showing a liquid container 1 having an etching solution 2 therein. Immersed in etching solution 2 in container 1 is a substrate 3 having disposed thereon conductor lines 5, each conductor line 5 having two terminal ends 4. Substantially parallel conductor lines 5 possess a near-short also referred to as a spacing violation or bridge remnant extending from one conductor line toward the other. Probes 11 are positioned as described in FIG. 2 above in the solution in contact with one terminal end 4 of each conductor line 5 and are connected to each other by wires 10 through power supply 7 having an ac volt-meter 8 and ac ammeter 9 in the circuit.

In accordance with the method for repairing the near-short, a voltage is applied on the pair of lines through probes 11. The remnants of the bridge 6 form an area with high field concentration which in turn generates an area of very high current concentration. This induces local electrolytic etching on both ends of the bridge remnants 6 and makes the gap larger. One example of the solution which can be used is dilute sulfuric acid. The solution used in the wet method described above to repair a near-short, must have the capacity to electrolytically etch the surface of the metal or have a higher etching rate at elevated temperature; i.e. 60–70° C., or both.

Figure 5:
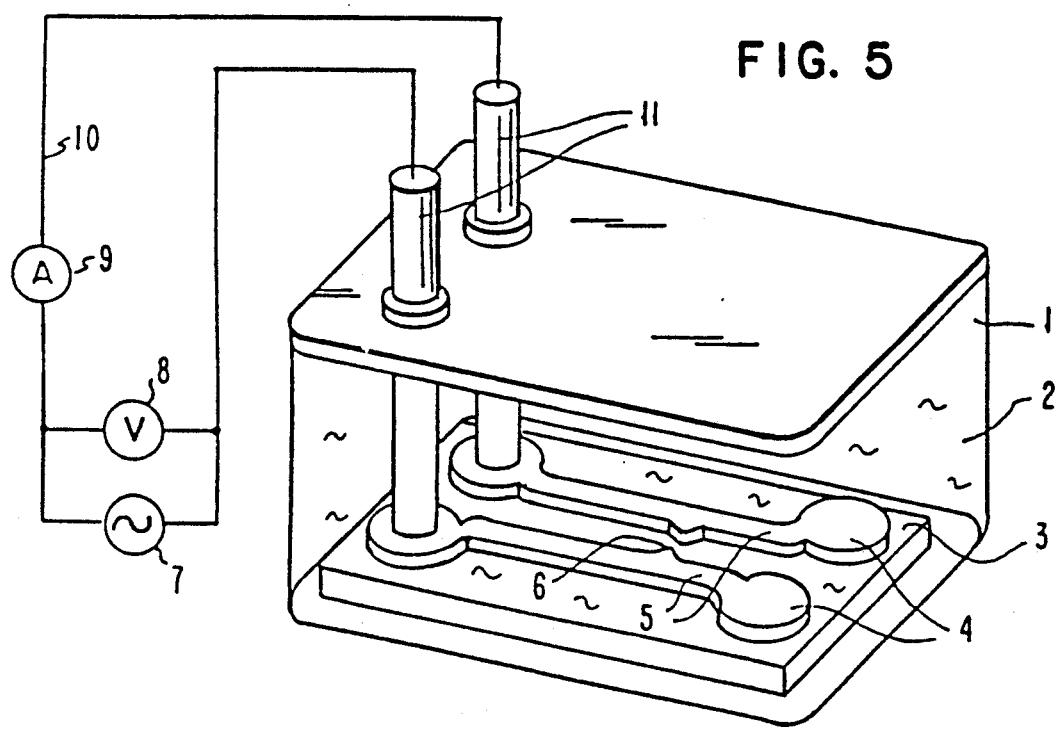
FIG. 5 is a perspective view of the system showing the repair of a circuit having a near-short or spacing violation in a chamber using an etching gas.

An alternative embodiment of the method of repairing near-shorts is illustrated in FIG. 5. FIG. 5 depicts a perspective view of a chamber 1 containing therein etching gas 2. One example of the etching gas that can be used is Ar (at 760 torr) optionally mixed with several Torrs of $CF_3Br$, or $Br_2$. In chamber 1 in contact with the etching gas 2, a substrate 3 having conductor lines 5 each having terminal ends 4 disposed thereon is positioned. A defect comprising a near-short, or bridge remnant is situated at site 6 between conductor lines 5. The circuit is connected by means of probes 11 which extend through the chamber onto the terminal ends 4 of conductor lines 5 and are connected to each other via wires 10 through power supply 7, ac volt-meter 8 and ac ammeter 9. The system comprises filling the chamber with the gas mixture detailed above at a high pressure, for example 760 Torr, and connecting pair of lines 5 having near-short 6 to a power supply 7 and ramping the voltage up, such that a local plasma occurs at the narrowest gap. Since the discharge process is highly non-linear, a plasma is highly localized. Etching occurs at two ends of the metal at near-short 6.

It is desirable to mix certain gases that generate reactive ions in the gas chamber and to apply a voltage so that etching is made more efficient, and the reaction product is volatile. For example, by mixing $CF_3Br$ with argon, bromine atoms (and excited atoms as well as ions) are generated which react with the copper and generate copper bromide which is volatile.

The dry treatment uses the same temperature dependence since at room temperature, bromine gas reacts with copper very slowly, whereas at about 80° C., the reaction becomes vigorous and the reaction product is slightly volatile. The invention is exemplified in the following examples.

In order to understand the invention more clearly the following examples are presented.

EXAMPLE 1

Parallel copper leads 11, 12 having a bridge 13 between them were arranged for the purpose of this experiment according to the schematic depicted in FIG. 6. Current (I) is then passed from lines 14, 15 through the lead 11, bridge 13, then through lead 12 and through the leads 16, 17. Bridge 13 was observed to be hotter than the adjacent leads 11, 12. Realizing that at room temperature, dilute sulfuric acid reacts with copper very slowly whereas at elevated temperature, for example, 90° C., the reaction rate is much higher, dilute $H_2SO_4$ was placed over bridge 13. As a result of the passing current through the pair of lines, the narrowest part of bridge 13 starts to dissolve. As the narrowest part of the neck was being etched, the local resistance was increasing. The local heating was then enhanced, which in turn accelerated the local etching process. The etching process at the narrowest part progressed exponentially to result in a complete open. In fact, during additional wet process tests, the near-open became in one instance a perfect line and another time a complete open. The results were dependent upon the composition of the liquid and the intensity of the electric current Since the liquid was conducting, after the bridge was broken, the etching process continued at the narrowest region of the gap, and rendered the edges of the leads further apart.

EXAMPLE 2

Using the circuit arrangement described in Example 1 above, and realizing that at room temperature, bromine gas reacts with copper slowly whereas at elevated temperature, the reaction becomes vigorous, the sample of FIG. 6 was placed in a gas chamber (not shown) containing $Br_2$. The current was passed through the pair of lines 11, 12. In this instance, the defective site was heated up to a temperature much greater than in the liquid of Example 1 where the boiling point of the liquid limited the extent to which the temperature could rise. An effective etching process occurred at the narrowest point of bridge 13. This etching process was also self-intensifying in that it terminated with a complete open, and stopped automatically.

Also effectively used in this dry process were $CF_3Br$ and $CF_3Cl$.

EXAMPLE 3

The gaps produced between defects in the lines obtained using the procedure disclosed in Examples 1 and 2 above were in some instances very narrow and could be considered as a near-short (see FIG. 1(d)). An equivalent liquid-phase process (i.e. the SIR near short process described herein) was then applied to widen the gap to a desirable dimension. Using an Ar and $CF_3Br$ proportional chosen gas mixture and alternatively, by changing the gas after all the shorts are opened, the entire process of repairing near-shorts and shorts was executed in the same chamber with a single electrical apparatus.

In the wet self-induced repair, etching process described above, the heat process terminates when a complete open is generated. However, the etching process will continue if a voltage of about one volt or less is applied on the pair of lines. The remnants of the bridge form an area with high field concentration, which in turn generates an area of very high current concentration. This induces local electrolytic etching on both ends of the remnants and makes the gap larger.

The advantages of the invention stemming from the selective additional heating at the site of the bridge can be further enhanced by using the discovery of the present invention in combination with the well-known Four-Color Theorem. With the aforementioned combination, the test for and repair of shorts and near-shorts can greatly reduce the cost of test and repair.

The "Four-Color Theorem" referred to above states that four colors suffice to color any planar map so that no two adjacent countries are the same color. (K. Appel and W. Haken, *Scientific American*, Sep. 1977, pp. 429–490.) If each of the plurality of conductor lines on a planar substrate are considered as a country, then the four color theorem implies that it is always possible to sort all the lines into four groups such that each section of spacing on the substrate is bounded by two conducting lines belonging to different groups.

As a consequence of the Four-Color Theorem, the entire task of testing and repairing can be done with a four-phase power supply having output pulses on its phases A, B, C and D with the time relationship depicted in FIG. 7a. Each phase is connected to an electrical conductor which in turn is connected to all of the lines in one group. The voltage differences between the pairs of conductors are illustrated in FIG. 7b.

As shown, an ac sequence of pulses is experienced between each pair of lines, i.e,., each section of spacing. Wherever there is a short circuit, a current should be detected. If all the shorts are self-repairable pursuant to the method of the present invention, by passing an appropriate set of current, all the shorts will be removed in a gas chamber or a etching tank. Then, the self-induced repairing process for near-shorts is started. It proceeds until all the near-shorts are removed.

Figure 8:
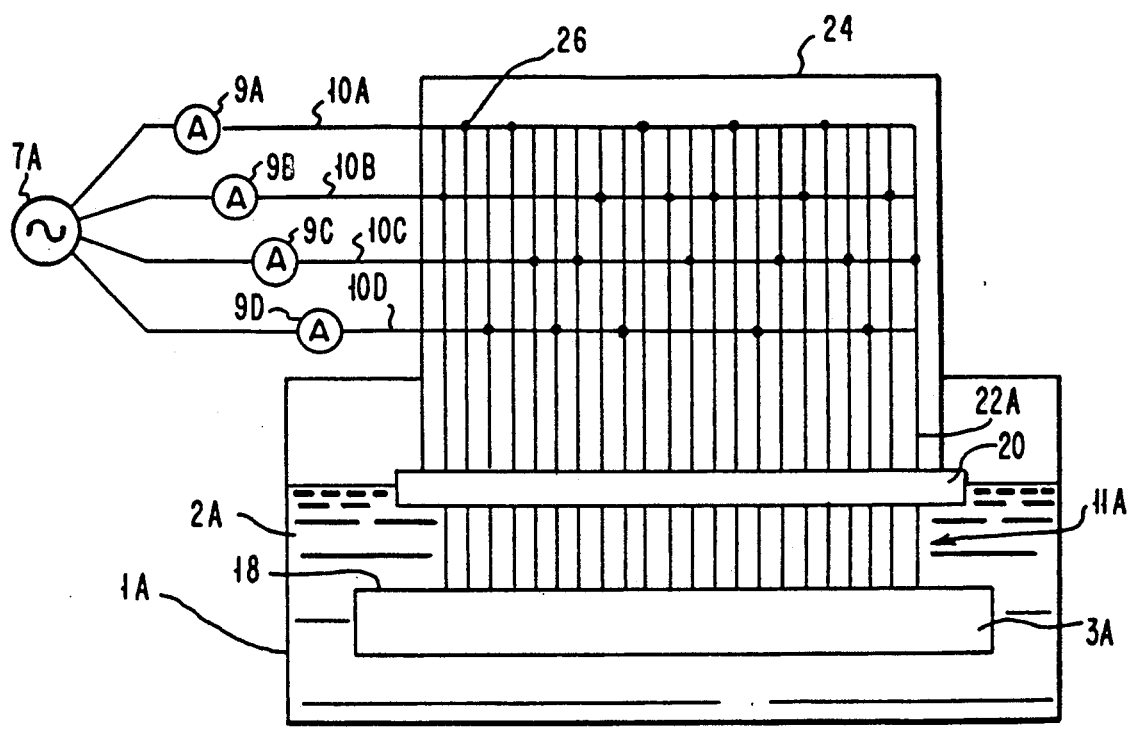
FIG. 8 is a simplified schematic diagram of an apparatus for repairing shorts and near shorts on an entire circuit.

FIG. 8 schematically illustrates an arrangement for repairing all shorts and near shorts present in electronic circuits, except for those involving gross defects which are so large that preferential heating of the defect does not occur when a current is passed. A container 1A having an etching fluid 2A therein receives a substrate 3A having numerous lines (not shown) on a planar surface 18 thereof formed of an electrically insulating material. Each line is contacted by at least one electrically conductive probe 11A extending from a probe carrier 20 formed of an electrically insulating material. The combination of probe carrier 20 and probes 11A is commonly known in the art as a "bed of nails." It is customized for the particular configuration of conductor lines for each different substrate 3A which is to be repaired.

Each probe 11A is connected to a line 22A associated with a programmable switching matrix 24. Four lines 10A, 10B, 10C and 10D connected through respective ac ammeters 9A, 9B, 9C and 9D to the four phases of alternating current power supply 7A, also are associated with programmable switching matrix 24.

Cross connections 26 are made within switching matrix 24 so that each probe 11A is electrically connected to only one phase of source 7A. In addition, the phase to which each probe 11A is electrically connected is chosen so that no adjacent lines on substrate 3A are connected to the same phase.

In order to accomplish this result, the lines on substrate 3A are classified into four groups satisfying the criteria that no adjacent lines belong to the same group. Each phase of source 7A is connected, by means of matrix 24 to every line on substrate 3A in its respective group and to no lines in other groups.

The ammeters 9A, 9B, 9C and 9D may be monitored to determine between which groups the shorts and near shorts exist. This information is important for monitoring the current as an indication of how the self-induced repairs are progressing. The measured values of currents may be used to control the voltage of supply 7A utilizing a feedback loop to achieve or maintain particular values of current as a function of time. Alternatively, in some applications volt-meters may be provided and the voltage of the phases adjusted in a manner, generally determined experimentally, which efficiently effects repairs.

The repairs conducted using the system of FIG. 8 may be accomplished utilizing the various fluids described above for the repair of shorts and near shorts. However, in the case of very thin bridges it may be possible to utilize the technique of applying a very strong current pulse (e.g , 50 amperes for each short, for 10 microsecond) to convert the shorts to near shorts. The present invention may then be used to repair the resulting near shorts. The arrangement illustrated in FIG. 8 is of benefit in that it is not required that the shorts all be located and individually repaired.

While the invention has been particularly shown and described with respect to the preferred embodiments thereof, it will be understood by those skilled in the art that the foregoing and other changes in form and details may be made therein without departing from the spirit and scope of the invention.

I claim:

1. An apparatus for the repair of electronic circuit shorts or near shorts resulting from, respectively, bridges or bridge remnants between lines comprising:
   connection means for making an electrical connection to each of said lines;
   grouping means for classifying each of the lines into four distinct groups so that no adjacent lines belong to the same group and for providing a separate electrical connection means to each of said groups, each said electrical connection means extending to each line in its respective group; and
   electrical energy means for supplying an appropriate voltage between selected pairs of said electrical connection means sequentially until said voltage has been applied at least once to each pair, said voltage being sufficient to cause temperature of said bridges or remnants thereof to be greater than temperature of said lines, and to cause removal of said bridges or remnants thereof.

2. The apparatus of claim 1 further comprising:
   fluid handling means for causing a fluid capable of maintaining a heterolocalized etching to contact said bridges or remnants thereof while said electrical energy means supplies said voltage.

3. The apparatus of claim 1 wherein said electrical energy means is a four phase alternating current supply and each phase thereof is connected to a different one of said electrical connection means.

4. The apparatus of claim 3 wherein each phase supplies a voltage pulse at a time different than each other phase.

5. The apparatus of claim 1 wherein said connection means includes a plurality of electrical connector pins, each pin being for connection to one of said electrical connection means.

6. The apparatus of claim 1 wherein said grouping means comprises a plurality of programmable electronic switches for connecting each of said lines to one of said electrical connection means.

7. The apparatus of claim 1 wherein said fluid handling means comprises a container for an etching liquid.

8. The apparatus of claim 1 wherein said fluid handling means comprises a container for an etching gas.

9. The apparatus of claim 1 further comprising current monitoring means for monitoring the current carried by each of said electrical connection means.

10. The apparatus of claim 1 wherein said electrical energy means supplies a current of a sufficient magnitude and for a sufficient time to cause a bridge to become electrically non-conductive.

11. The apparatus of claim 10 wherein, for each short, the current is approximately 50 amperes.

12. The apparatus of claim 10 wherein the current is applied for a period of approximatelY 10 microseconds.

13. A method for repairing electronic circuit shorts or near shorts resulting from, respectively, bridges or remnants thereof between lines comprising:
 classifying the lines into four groups so that no adjacent lines belong to the same group;
 providing an electrical connection means for each of said groups which electrically connects to each line in its respective group;
 applying an appropriate voltage sequentially between selected parts of said electrical connection means until a voltage has been applied at least once to each said pairs, said voltage being sufficient to cause temperature of said bridges or remnants thereof to be greater than that of said lines and to cause removal of said bridges or remnants thereof.

14. The method of claim 13 further comprising concurrently contacting sites of said bridges or remnants thereof with a fluid capable of maintaining a heterolocalized etching process.

15. The method of claim 13 wherein each of said electrical connection means is connected to one phase of a four phase alternating current supply.

16. The method of claim 15 wherein each of said four phases supplies a voltage pulse at a time different than each other phase.

17. The method of claim 13 wherein said step of providing an electrical connection means comprises:
 programming an array of connectors so that each line is connected to only one phase.

18. An apparatus for the repair of an electrical circuit short resulting from a bridge between lines, comprising:
 connection means for selectively making an electrical connection to two adjacent ones of said lines; and
 means for applying a voltage to said electrical connection means, said voltage causing a current of sufficient magnitude to flow through said bridge to cause removal of said bridge.

19. The apparatus of claim 18 wherein said connection means connects to two points along each one of said adjacent lines, said points being disposed along said lines on opposite sides of said bridge.

20. A method for the repair of an electric current short resulting from a bridge between lines, comprising:
 providing an electrical connection means to each of two adjacent lines; and
 applying a voltage to said electrical connection means so that a current flows through said bridge, said current being of sufficient magnitude to cause removal of said bridge.

21. The method of claim 20 wherein said electrical connection means comprises two connections for each line, and wherein said connections are disposed along each line so that said bridge is between said two connections of both lines.

* * * * *